United States Patent
Ouchi

(10) Patent No.: US 7,746,199 B2
(45) Date of Patent: Jun. 29, 2010

(54) ACOUSTIC WAVE DEVICE

(75) Inventor: Minefumi Ouchi, Nomi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/428,715

(22) Filed: Apr. 23, 2009

(65) Prior Publication Data

US 2009/0201105 A1    Aug. 13, 2009

Related U.S. Application Data

(63) Continuation of application No. PCT/JP2007/072933, filed on Nov. 28, 2007.

(30) Foreign Application Priority Data

Dec. 25, 2006    (JP) .............................. 2006-347576

(51) Int. Cl.
*H03H 9/64* (2006.01)
(52) U.S. Cl. ...................... 333/193; 333/195
(58) Field of Classification Search ................. 333/195, 333/133, 193
See application file for complete search history.

(56) References Cited

U.S. PATENT DOCUMENTS

| | | | |
|---|---|---|---|
| 6,504,454 B2 * | 1/2003 | Takahashi | 333/195 |
| 6,781,483 B2 * | 8/2004 | Tanaka et al. | 333/193 |
| 6,828,878 B2 * | 12/2004 | Takamine et al. | 333/193 |
| 7,034,639 B2 * | 4/2006 | Takamine et al. | 333/195 |
| 7,135,944 B2 * | 11/2006 | Iwamoto et al. | 333/133 |
| 2001/0043024 A1 | 11/2001 | Takamine et al. | |
| 2002/0075102 A1 | 6/2002 | Tanaka et al. | |
| 2003/0155993 A1 | 8/2003 | Takamine et al. | |
| 2004/0155730 A1 | 8/2004 | Iwamoto et al. | |

FOREIGN PATENT DOCUMENTS

| | | |
|---|---|---|
| EP | 1 701 441 A1 | 9/2006 |
| JP | 04-040705 A | 2/1992 |
| JP | 05-267990 A | 10/1993 |
| JP | 2000-349590 A | 12/2000 |

OTHER PUBLICATIONS

Official Communication issued in International Patent Application No. PCT/JP2007/072933, mailed on Mar. 18, 2008.

* cited by examiner

*Primary Examiner*—Benny Lee
*Assistant Examiner*—Alan Wong
(74) *Attorney, Agent, or Firm*—Keating & Bennett, LLP

(57) ABSTRACT

An acoustic wave device includes first and second 3-IDT acoustic wave filters provided on a piezoelectric substrate. A second IDT in the first acoustic wave filter is electrically connected to a second IDT in the second acoustic wave filter and a third IDT in the first acoustic wave filter is electrically connected to a third IDT in the second acoustic wave filter to cascade the first acoustic wave filter with the second acoustic wave filter. An acoustic wave resonator is connected to a first IDT in the first acoustic wave filter. In the acoustic wave device, NA/NB is in a range from about 2.6 to about 3.5 and fB/fa is in a range from about 0.995 to about 1.010.

7 Claims, 8 Drawing Sheets

ACOUSTIC WAVE DEVICE

BACKGROUND OF THE INVENTION

1. Field of the Invention

The present invention relates to an acoustic wave device used as, for example, a band-pass filter. More particularly, the present invention relates to a resonator-type acoustic wave device in which first and second acoustic wave filters are cascade connected with each other.

2. Description of the Related Art

Band-pass filters used at the transmission side of mobile phones must have greater amounts of attenuation in reception-side passbands. In contrast, for example, personal communication systems (PCSs) must have sufficiently small insertion losses in the passbands and sufficiently large amounts of attenuation in blocking bands near the passbands because of the narrow interval between the transmission bands and the reception bands. Accordingly, such systems must have sufficiently steep filter characteristics.

Japanese Unexamined Patent Application Publication No. 2000-349590 discloses a surface acoustic wave device capable of increasing the amount of attenuation in the blocking band near the high-frequency side of the passband. FIG. 17 is a schematic plan view of the surface acoustic wave device disclosed in Japanese Unexamined Patent Application Publication No. 2000-349590.

A surface acoustic wave device 1001 includes a piezoelectric substrate 1002. An electrode structure shown in FIG. 17 is provided on the piezoelectric substrate 1002 to define the surface acoustic wave device in which first and second longitudinally-coupled resonator-type surface acoustic wave filters 1003 and 1004 are cascade connected with each other.

Specifically, the first surface acoustic wave filter 1003 is cascade connected with the second surface acoustic wave filter 1004.

The first surface acoustic wave filter 1003 includes a first interdigital transducer (IDT) 1003a and second and third IDTs 1003b and 1003c that are arranged on either side of the first IDT 1003a in the direction in which surface waves propagate. Reflectors 1003d and 1003e are arranged on either side of the portion in which the IDTs 1003a to 1003c are arranged in the direction in which the surface waves propagate.

Similarly, the second surface acoustic wave filter 1004 includes a first IDT 1004a, second and third IDTs 1004b and 1004c that are arranged on either side of the first IDT 1004a in the direction in which the surface waves propagate, and reflectors 1004d and 1004e. Referring to FIG. 17, one end of the IDT 1003a in the first surface acoustic wave filter 1003 is connected to an input electrode pad 1005 and the other end thereof is electrically connected to a ground electrode pad 1006. One end of the second IDT 1003b is connected to one end of the third IDT 1003c via a connection electrode 1007. The other end of the second IDT 1003b is connected to a first signal line 1008 and the other end of the third IDT 1003c is connected to a second signal line 1009. A surface acoustic wave resonator 1010 is provided between the first surface acoustic wave filter 1003 and the second surface acoustic wave filter 1004. The surface acoustic wave resonator 1010 includes an IDT and first and second reflectors arranged at either side of the IDT.

The first signal line 1008 and the second signal line 1009 are connected to one end of the IDT of the surface acoustic wave resonator 1010. Third and fourth signal lines 1011 and 1012 are connected to the other end of the IDT of the surface acoustic wave resonator 1010. The third signal line 1011 is connected to one end of the second IDT 1004b in the second surface acoustic wave filter 1004. The fourth signal line 1012 is connected to one end of the third IDT 1004c. The other end of the second IDT 1004b is connected to the other end of the third IDT 1004c via a connection electrode 1013. One end of the central first IDT 1004a is connected to a ground electrode pad 1014 and the other end thereof is connected to an output electrode pad 1015.

In the surface acoustic wave device 1001, the impedance characteristics at an anti-resonance point of the surface acoustic wave resonator 1010 can be used to increase the amount of attenuation at the high-frequency side of the passband and to increase the steepness of the filter characteristics at the high-frequency side of the passband.

However, since it is necessary to connect the surface acoustic wave resonator 1010 in series between the first and second surface acoustic wave filters 1003 and 1004 in the surface acoustic wave device 1001 described in Japanese Unexamined Patent Application Publication No. 2000-349590, it is necessary to provide a sufficiently large space between the first and second surface acoustic wave filters 1003 and 1004. In other words, since it is necessary to arrange the surface acoustic wave resonator 1010 between the first and second surface acoustic wave filters 1003 and 1004, to connect the first and second surface acoustic wave filters 1003 and 1004 to the surface acoustic wave resonator 1010 via the signal lines 1008, 1009, 1011, 1012, etc., and to provide the ground electrode pads 1006 and 1014, it is necessary to provide a large amount of space between the stages. Accordingly, it is difficult to reduce the size of the surface acoustic wave device 1001.

In order to resolve such a problem, the surface acoustic wave resonator may be connected in series between either of an input terminal and an output terminal and the first surface acoustic wave filter or the second surface acoustic wave filter in a structure in which first and second longitudinally-coupled resonator-type surface acoustic wave filters are cascade connected with each other. However, the symmetry between the configuration from the input terminal to the first surface acoustic wave filter and the configuration from the second surface acoustic wave filter to the output terminal is adversely affected in such a structure. In other words, since the configuration at the input side is asymmetric with the configuration at the output side, it is necessary to design the surface acoustic wave filter at each stage in order to achieve the impedance matching. However, a specific design method for the first and second surface acoustic wave filters is unknown in the above configuration.

In recent years, various boundary acoustic wave devices utilizing boundary acoustic waves have been proposed, instead of the surface acoustic wave devices. Also in the boundary acoustic wave devices, a specific design method for first and second surface acoustic wave filters to improve the filter characteristics by using a similar structure is unknown.

SUMMARY OF THE INVENTION

In order to overcome the problems described above, preferred embodiments of the present invention provide an acoustic wave device including first and second longitudinally-coupled resonator-type acoustic wave filters that are cascade connected with each other and an acoustic wave resonator that is connected in series between either of the acoustic wave filters and an input terminal or an output terminal and that is capable of reducing the size, has a sufficiently large amount of attenuation in a blocking band near the high-frequency side of the passband, and has an increased steepness of the filter characteristics.

According to a preferred embodiment of the present invention, an acoustic wave device includes first and second longitudinally-coupled resonator-type acoustic wave filters each including a piezoelectric substrate, a first IDT provided on the piezoelectric substrate, second and third IDTs arranged on either side of the first IDT in the direction in which surface waves propagate, and a pair of reflectors arranged on either side of the portion in which the first to third IDTs are provided in the direction in which the surface waves propagate, and an acoustic wave resonator provided on the piezoelectric substrate. The second IDT in the first acoustic wave filter is electrically connected to the second IDT in the second acoustic wave filter and the third IDT in the first acoustic wave filter is electrically connected to the third IDT in the second acoustic wave filter to cascade the first acoustic wave filter with the second acoustic wave filter. The acoustic wave resonator is connected to an end of the first IDT in the first acoustic wave filter, which is opposite to the second acoustic wave filter. In the acoustic wave device, NA/NB is in a range from about 2.6 to about 3.5 where NA denotes the number of electrode fingers of the first IDT in the first acoustic wave filter and NB denotes the number of electrode fingers of each of the second and third IDTs in the first acoustic wave filter, and fB/fa is a range from about 0.995 to about 1.010 where fB denotes the end frequency of a stop band of each of the reflectors in the first and second acoustic wave filters and fa denotes an anti-resonant frequency of the acoustic wave resonator.

Preferably, two acoustic wave devices described above are provided. When the two acoustic wave devices are referred to as first and second acoustic wave devices, one end of the first acoustic wave device and one end of the second acoustic wave device are connected to an unbalanced terminal, the other end of the first acoustic wave device is connected to a first balanced terminal, and the other end of the second acoustic wave device is connected to a second balanced terminal. The first to third IDT electrodes in the first and second acoustic wave devices are arranged so that an output signal corresponding to an input signal in the first acoustic wave device is out of phase with an output signal corresponding to an input signal in the second acoustic wave device by about 180°. In this case, it is possible to reduce the size of the acoustic wave device and to achieve a large amount of attenuation and increase the steepness of the filter characteristics in the blocking band at the high-frequency side of the passband. In addition, it is possible to provide the acoustic wave device having a balance-unbalance conversion function.

In preferred embodiments of the present invention, preferably, the first IDT in the first acoustic wave filter is connected to an unbalanced terminal via the acoustic wave resonator, one end of the first IDT in the second acoustic wave filter is connected to a first balanced terminal, and the other end thereof is connected to a second balanced terminal. The first to third IDTs in the first and second acoustic wave filters are arranged so that a signal flowing from the unbalanced terminal to the first balanced terminal is out of phase with a signal flowing from the unbalanced terminal to the second balanced terminal by about 180°.

In addition, it is possible to reduce the size of the acoustic wave device and to achieve the large amount of attenuation and increase the steepness of the filter characteristics in the blocking band at the high-frequency side of the passband. Furthermore, it is possible to provide the acoustic wave device having the balance-unbalance conversion function.

Preferably, one end of the first IDT in the first acoustic wave filter is connected to an unbalanced terminal via the acoustic wave resonator, the first IDT in the second acoustic wave filter includes first and second separated IDT portions that are separated in the direction in which acoustic waves propagate, and the first and second separated IDT portions are connected to first and second balanced terminals, respectively. The first to third IDTs in the first and second acoustic wave filters are arranged so that a signal flowing from the unbalanced terminal to the first balanced terminal is out of phase with a signal flowing from the unbalanced terminal to the second balanced terminal by about 180°.

In this case, it is possible to reduce the size of the acoustic wave device and to increase the amount of attenuation and the steepness of the filter characteristics in the blocking band at the high-frequency side of the passband. In addition, it is possible to provide the acoustic wave device having the balance-unbalance conversion function.

In a structure in which two acoustic wave devices of preferred embodiments of the present invention are provided, when the two acoustic wave devices are referred to as first and second acoustic wave devices, one end of the first acoustic wave device and one end of the second acoustic wave device may preferably be connected to a first unbalanced terminal and the other end of the first acoustic wave device and the other end of the second acoustic wave device may be connected to a second unbalanced terminal. In this case, it is possible to reduce the size of the acoustic wave device and to sufficiently increase the amount of attenuation and the steepness of the filter characteristics at the high-frequency side of the passband. In addition, it is possible to provide the unbalance input-output acoustic wave device.

In the acoustic wave device according to preferred embodiments of the present invention, a surface acoustic wave may preferably be used to define a surface acoustic wave device or a boundary acoustic wave may be used to define a boundary acoustic wave device.

In the acoustic wave device according to preferred embodiments of the present invention, the first and second longitudinally-coupled resonator-type acoustic wave filters and the acoustic wave resonator are provided on the piezoelectric substrate, and the second IDT in the first acoustic wave filter is electrically connected to the second IDT in the second acoustic wave filter and the third IDT in the first acoustic wave filter is electrically connected to the third IDT in the second acoustic wave filter to cascade the first acoustic wave filter with the second acoustic wave filter. Since the acoustic wave resonator is connected to an end of the first IDT in the first acoustic wave filter, which is opposite to the second acoustic wave filter, that is, since the acoustic wave resonator is not connected between the stages, a large space is not required between the stages. Accordingly, it is possible to reduce the size of the acoustic wave device.

In addition, NA/NB is in a range from about 2.6 to about 3.5, where NA denotes the number of electrode fingers of the first IDT in the first acoustic wave filter and NB denotes the number of electrode fingers of each of the second and third IDTs in the first acoustic wave filter, and fB/fa is in a range from about 0.995 to about 1.010 where fB denotes the end frequency of a stop band of each of the reflectors in the first and second acoustic wave filters and fa denotes an anti-resonant frequency of the acoustic wave resonator. Accordingly, it is possible to sufficiently increase the amount of attenuation and the steepness of the filter characteristics in the blocking band at high-frequency side of the passband.

This is possibly because setting the ratio of the number of electrode fingers of the first IDT to the number of electrode fingers of each of the second and third IDTs to a value within the predetermined range in the first acoustic wave filter to which the acoustic wave resonator is connected enables the response in the blocking band to be suppressed. This is possibly also because setting the location of the stop band of the reflector to a frequency position within the predetermined range to position the point at which the reflection efficiency is decreased, that is, the end of the stop band near the anti-resonant frequency of the acoustic wave resonator enables the steepness of the filter characteristics at the high-frequency side of the passband and the amount of attenuation in the blocking band near the high-frequency side of the passband to be increased.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described with reference to the attached drawings.

Figure 1:
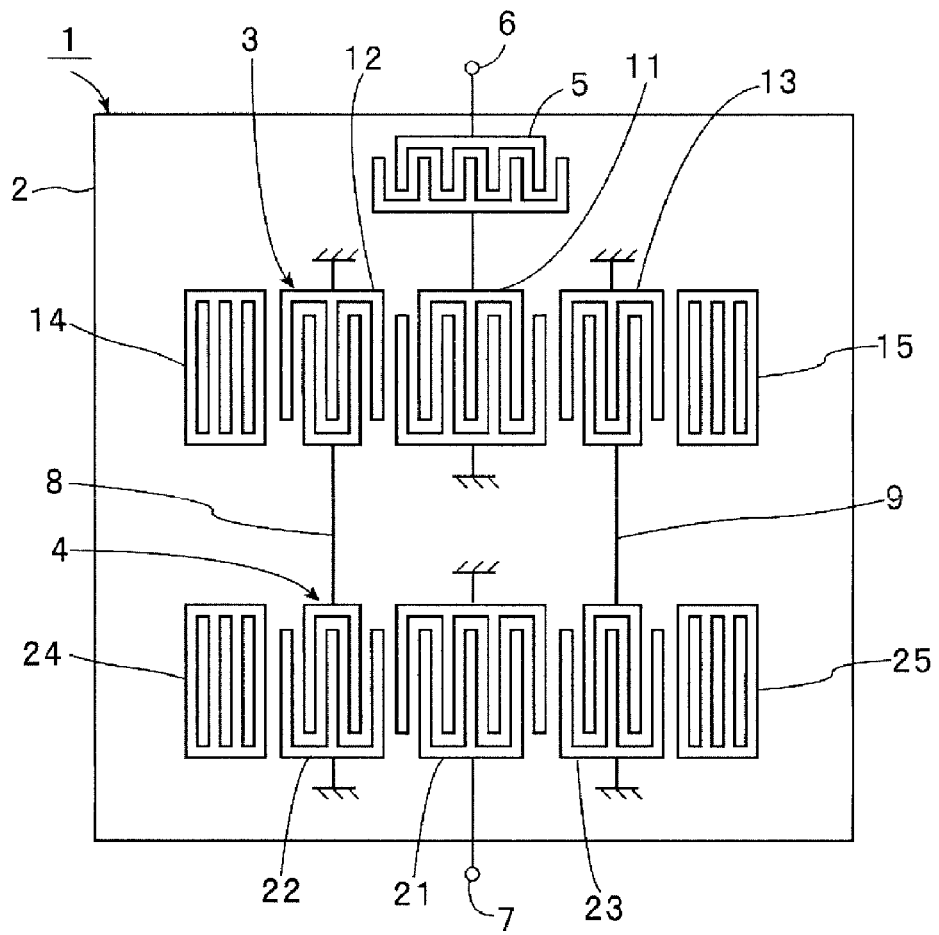
FIG. 1 is a schematic plan view showing the electrode structure of a surface acoustic wave device according to a first preferred embodiment of the present invention.

FIG. 1 is a schematic plan view of a surface acoustic wave device according to a first preferred embodiment of the present invention.

A surface acoustic wave device 1 of the present preferred embodiment is a band-pass filter used as a PCS transmission filter. The passband of the PCS transmission band-pass filter ranges from 1,850 MHz to 1,910 MHz and the reception-side passband is in an attenuation band at the high-frequency side of the passband. This reception-side passband ranges from 1,930 MHz to 1,990 MHz. Accordingly, the surface acoustic wave device must have a large amount of attenuation in the attenuation band in the vicinity of the high-frequency side of the transmission passband.

The surface acoustic wave device 1 includes a piezoelectric substrate 2. The piezoelectric substrate 2 is preferably made of X-propagation LiTaO$_3$ that is Y-cut at 40±5°, for example.

An electrode structure preferably including aluminum (Al) electrodes, for example, shown in FIG. 1, is provided on the piezoelectric substrate 2. The material of the electrodes is not restricted to aluminum and the electrodes may be made of an alloy primarily including aluminum, another appropriate metal, or another appropriate alloy.

The electrode structure provided on the piezoelectric substrate 2 includes first and second surface acoustic wave filters 3 and 4 and a surface acoustic wave resonator 5.

Both of the first and second surface acoustic wave filters 3 and 4 are 3-IDT longitudinally-coupled resonator-type surface acoustic wave filters. The first longitudinally-coupled resonator-type surface acoustic wave filter 3 includes a first IDT 11 and second and third IDTs 12 and 13 that are arranged on either side of the first IDT 11 in the direction in which surface waves propagate. Reflectors 14 and 15 are arranged on either side of the area in which the first to third IDTs 11 to 13 are provided in the direction in which the surface waves propagate.

Similarly, the second surface acoustic wave filter 4 includes a first IDT 21, second and third IDTs 22 and 23 that are arranged on either side of the first IDT 21 in the direction in which the surface waves propagate, and reflectors 24 and 25. The surface acoustic wave resonator 5 includes an IDT and a pair of reflectors (not shown) arranged on either side of the IDT.

The surface acoustic wave resonator 5 may be a surface acoustic wave resonator including only an IDT.

One end of the first IDT 11 in the first surface acoustic wave filter 3 is connected to an input terminal 6 via the surface acoustic wave resonator 5. In other words, the surface acoustic wave resonator 5 is connected in series to the first surface acoustic wave filter 3.

The other end of the first IDT 11 is grounded. One end of the second IDT 12 and one end of the third IDT 13 are grounded.

The other end of the second IDT 12 is connected to one end of the second IDT 22 in the second surface acoustic wave filter 4 via a first signal line 8. The other end of the second IDT 22 is grounded.

The other end of the third IDT 13 is connected to one end of the third IDT 23 in the second surface acoustic wave filter 4 via a second signal line 9. The other end of the third IDT 23 is grounded.

In other words, the second IDT 12 is electrically connected to the second IDT 22 via the first signal line 8 and the third IDT 13 is electrically connected to the third IDT 23 via the second signal line 9 to cascade the first surface acoustic wave filter 3 with the second surface acoustic wave filter 4.

One end of the first IDT 21 in the second surface acoustic wave filter 4 is grounded and the other end thereof is connected to an output terminal 7.

According to the present preferred embodiment, the surface acoustic wave resonator 5 is not connected between the first surface acoustic wave filter 3 and the second surface acoustic wave filter 4 but is connected between the first IDT 11 in the first surface acoustic wave filter 3 and the input terminal 6, as described above. In other words, the surface acoustic wave resonator 5 is connected to the end of the first IDT 11, which is opposite to the second surface acoustic wave filter 4. Accordingly, a large space is not required between the stages.

Although the IDTs 11 to 13 and 21 to 23 are schematically shown in FIG. 1, narrow-pitch electrode fingers are preferably provided in the IDTs 11 to 13 and 21 to 23. The narrow-pitch electrode fingers mean electrode fingers which are provided at the ends of the IDTs in the portions at which the IDTs are adjacent to each other and whose pitches are smaller than those of the other portions of the IDTs. The narrow-pitch electrode fingers are preferably provided at the ends of the IDTs in the portions in which the IDTs are adjacent to each other. For example, the provision of the narrow-pitch electrode fingers at the end of the second IDT 12 toward the first IDT 11 and at the end of the first IDT 11 toward the second IDT 12 in the portion at which the second IDT 12 is adjacent to the first IDT 11 enables the discontinuity of the portion at which the first IDT 11 is adjacent to the second IDT 12 to be reduced. By adjusting distance between the adjacent IDTs with narrow-pitch electrode fingers, loss can be decreased and a broader pass band can be obtained.

However, the narrow-pitch electrode fingers may not necessarily be provided in the portions at which the IDTs are adjacent to each other.

In the surface acoustic wave device 1 of the present preferred embodiment, the surface acoustic wave resonator 5 is connected between the first IDT 11 in the first surface acoustic wave filter and the input terminal 6, instead of between the stages, as described above. In addition, in the surface acoustic wave device 1 of the present preferred embodiment, the number of electrode fingers of each of the first to third IDTs 11 to 13 in the first surface acoustic wave filter 3, which is the surface acoustic wave filter at the side at which the surface acoustic wave resonator 5 is connected, is set within a predetermined range and the end frequency of the stop band of each of the reflectors in the first and second surface acoustic wave filters 3 and 4 is set within a predetermined range. These settings not only enable a reduction in the size of the surface acoustic wave device but also achieve a large amount of attenuation at the high-frequency side of the passband, and also enable the steepness of the filter characteristics to be increased. This will be described in detail.

The surface acoustic wave device 1 is manufactured preferably to have the following specifications, for example:

Cross width of the electrode fingers of the IDTs 11 to 13 in the first surface acoustic wave filter 3 and of the IDTs 21 to 23 in the second surface acoustic wave filter 4: about 70 µm Cross width of the surface acoustic wave resonator 5: about 45 µm Wavelength λr defined by the electrode finger pitch of the reflectors 14, 15, 24, and 25: about 2.16 µm Wavelength defined by the electrode finger pitch of the second IDT 12, the third IDT 13, the second IDT 22, and the third IDT 23: about 0.989 λr Wavelength of the first IDT 11: about 1.002 λr Wavelength of the first IDT 21: about 1.001 λr Wavelength of the IDT of the surface acoustic wave resonator 5: about 0.982 λr The numbers of electrode fingers of the IDTs in the first surface acoustic wave filter 3: 29 for the second IDT 12/87 for the first IDT 11/29 for the third IDT 13

The numbers of electrode fingers of the IDTs in the second surface acoustic wave filter: 29 for the second IDT 22/79 for the first IDT 21/29 for the third IDT 23

The number of electrode fingers of the IDT in the surface acoustic wave resonator 5: 200

Figure 2:
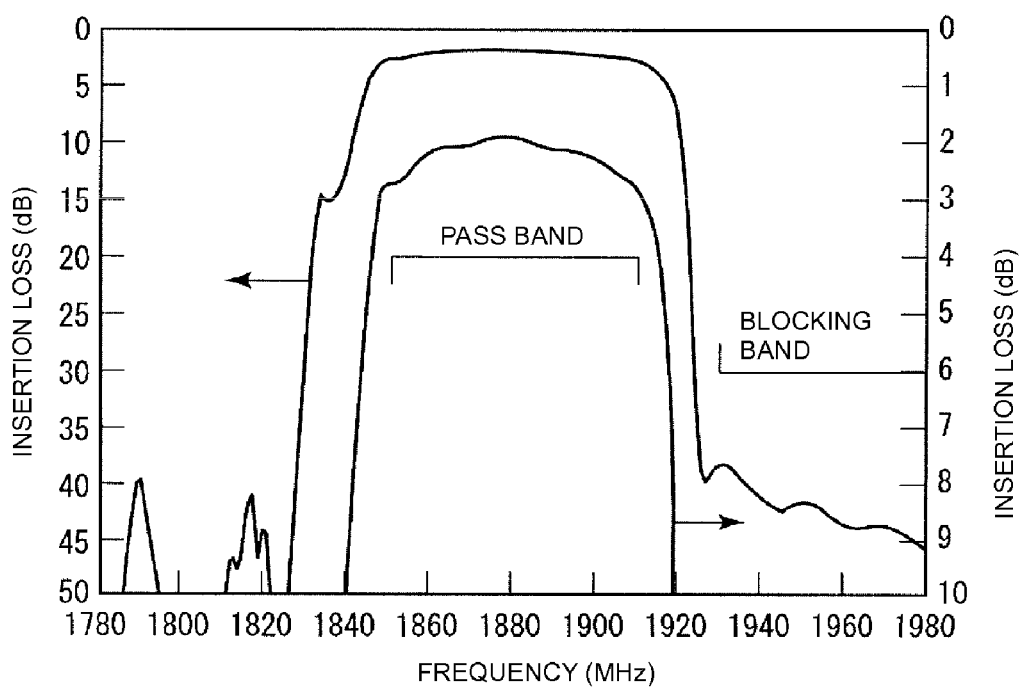
FIG. 2 illustrates the filter characteristics of the surface acoustic wave device of the first preferred embodiment of the present invention.

The attenuation-frequency characteristics of the surface acoustic wave device 1 area shown in FIG. 2. As shown in FIG. 2, the attenuation band is provided at the high-frequency side of the passband ranging from 1,850 MHz to 1,910 MHz. In the attenuation band, a large amount of attenuation is provided in the blocking band near the high-frequency side of the passband and an increased steepness is provided from the passband to the high-frequency side attenuation band. More specifically, the steepness at the high-frequency side of the passband is preferably about 9.1 MHz that is from about 4.0 dB point, which is through basis of pass band, to about 30 dB point, and the amount of attenuation in the blocking band is about 38 dB.

The large amount of attenuation and the steepness are provided in the blocking band near the high-frequency side of the passband in the present preferred embodiment, as described above, because the number of electrode fingers of each of the first to third IDTs 11 to 13 in the first surface acoustic wave filter 3 to which the surface acoustic wave resonator 5 is connected is set within the predetermined range and the end frequency of the stop band of each of the reflectors 14, 15, 24, and 25 in the first and second surface acoustic wave filters 3 and 4 is set within the predetermined range.

Figure 3:
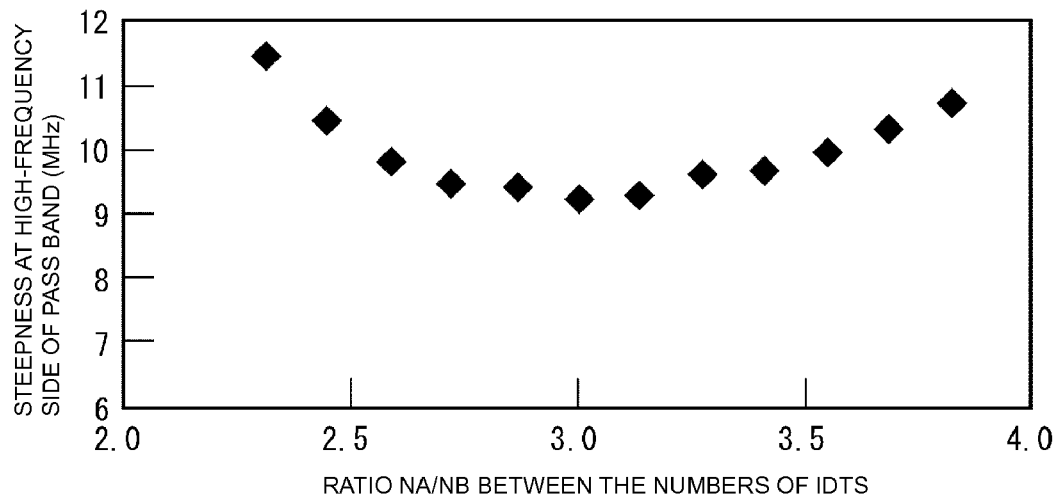
FIG. 3 shows how the steepness at the high-frequency side of the passband is varied relative to a ratio NA/NB between the numbers of electrode fingers of IDTs in the surface acoustic wave device of the first preferred embodiment of the present invention.

Specifically, in the present preferred embodiment, when NA denotes the number of electrode fingers of the first IDT 11 and NB denotes the number of electrode fingers of each of the second and third IDTs 12 and 13 in the first surface acoustic wave filter 3, NA/NB=87/29=3. FIG. 3 shows how the steepness at the high-frequency side of the passband of the surface acoustic wave device 1 is varied when the ratio NA/NB between the numbers of electrode fingers is varied. The steepness at the high-frequency side of the passband means the frequency width of the portion at which the amount of attenuation indicating the through basis of the passband is varied from about 4.0 dB to about 30 dB at the high-frequency side of the passband, as described above. The steepness at the high-frequency side of the passband means this frequency width in the following description as well.

As shown in FIG. 3, the steepness at the high-frequency side of the passband is minimized when NA/NB is approximately equal to three and the steepness at the high-frequency side of the passband is less than about 10 MHz when NA/NB is within a range from about 2.6 to about 3.5, for example.

Figure 4:
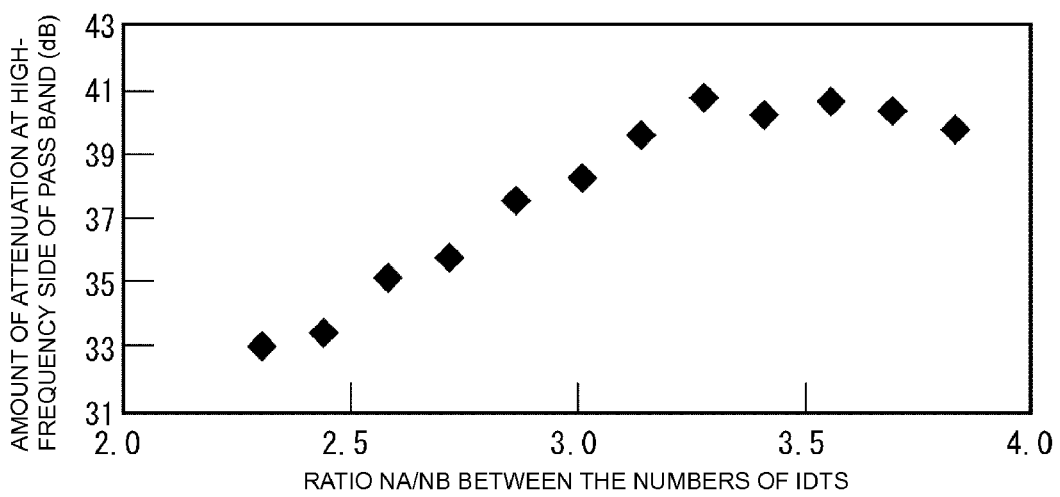
FIG. 4 shows how the amount of attenuation in the blocking band at the high-frequency side of the passband is varied relative to the ratio NA/NB between the numbers of electrode fingers of the IDTs in the surface acoustic wave device of the first preferred embodiment of the present invention.

In contrast, FIG. 4 shows how the amount of attenuation at the high-frequency side of the passband is varied when NA/NB is varied. The amount of attenuation at the high-frequency side of the passband means the minimum amount of attenuation in the blocking band at the high-frequency side of the passband, that is, in the reception-side frequency band from 1,930 MHz to 1,990 MHz.

As shown in FIG. 4, the amount of attenuation tends to increase when the ratio NA/NB is increased. If NA/NB exceeds about 3.2, the tendency for the amount of attenuation at the high-frequency side to increase is almost saturated. If NA/NB is greater than about 2.6, the amount of attenuation in the blocking band at the high-frequency side is greater than about 35 dB.

Accordingly, as shown in FIGS. 3 and 4, the amount of attenuation at the high-frequency side becomes sufficiently large, that is, about 35 dB or greater and the excellent steepness of the filter characteristics is provided at the high-frequency side of the passband when NA/NB is within the range from about 2.6 to about 3.5.

Since NA/NB=3 in the above-described preferred embodiment, the large amount of attenuation is provided and the steepness of the filter characteristics is increased in the blocking band at the high-frequency side of the passband, as described above. As shown in FIGS. 3 and 4, when NA/NB is within the range from about 2.6 to about 3.5, the large amount of attenuation and the excellent steepness of the filter characteristics can be achieved.

Figure 5:
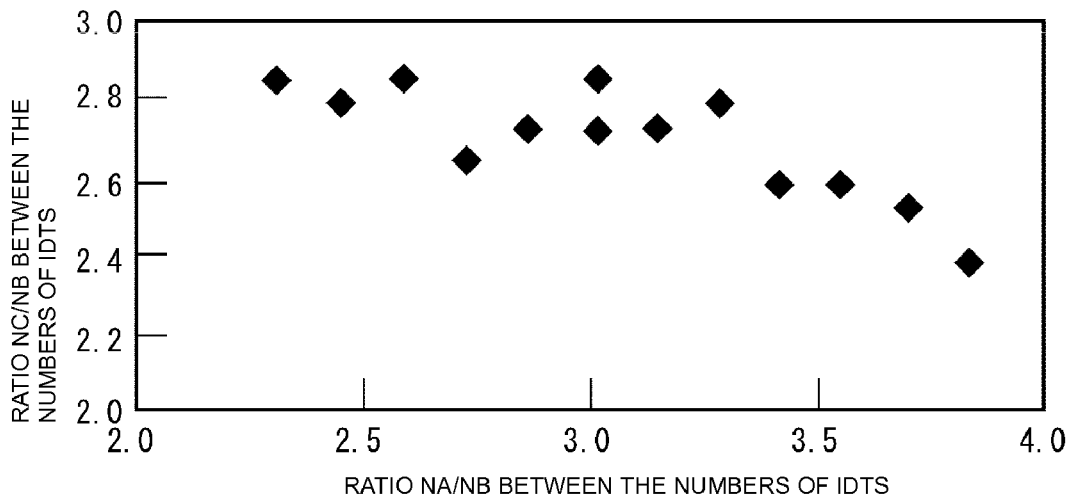
FIG. 5 is a graph showing the relationship between the ratio NA/NB between the numbers of electrode fingers of the IDTs and a ratio NC/NB between the numbers of electrode fingers of IDTs in the surface acoustic wave device of the first preferred embodiment of the present invention.

FIG. 5 is a graph showing the relationship between the ratio NA/NB between the numbers of electrode fingers in the first surface acoustic wave filter 3 and a ratio NC/NB between the numbers of electrode fingers of the IDT in the second surface acoustic wave filter when an excellent amount of attenuation and an excellent steepness of the filter characteristics are achieved, where NC denotes the number of electrode fingers of the first IDT 21 in the second surface acoustic wave filter 4. The number of electrode fingers of each of the second and third IDTs 22 and 23 in the second surface acoustic wave filter 4 is the same or substantially the same as the number NB of electrode fingers of each of the second and third IDTs 12 and 13 in the first surface acoustic wave filter 3.

FIG. 5 shows that the number NC/NB of the electrode fingers in the second surface acoustic wave filter should be set to a value within a range from about 2.6 to about 2.85 in order to achieve excellent characteristics when the ratio NA/NB between the numbers of electrode fingers in the first surface acoustic wave filter is set to a value within the range from about 2.6 to about 3.5, as described above. These values apply when a terminal impedance Z1 at the input terminal 6 corresponds to a terminal impedance Z2 at the output terminal 7, and NC/NB has an optimum range that is different from the range from about 2.6 to about 2.85 if the ratio of Z2 to Z1 is shifted from about one.

As described above, it is sufficient to set NA/NB to a value within the range from about 2.6 to about 3.5 in order to sufficiently increase the amount of attenuation and increase the steepness of the filter characteristics in the blocking band at the high-frequency side of the passband. The range of NC/NB may be appropriately selected in accordance with the ratio of Z2 to Z1.

Figure 6:
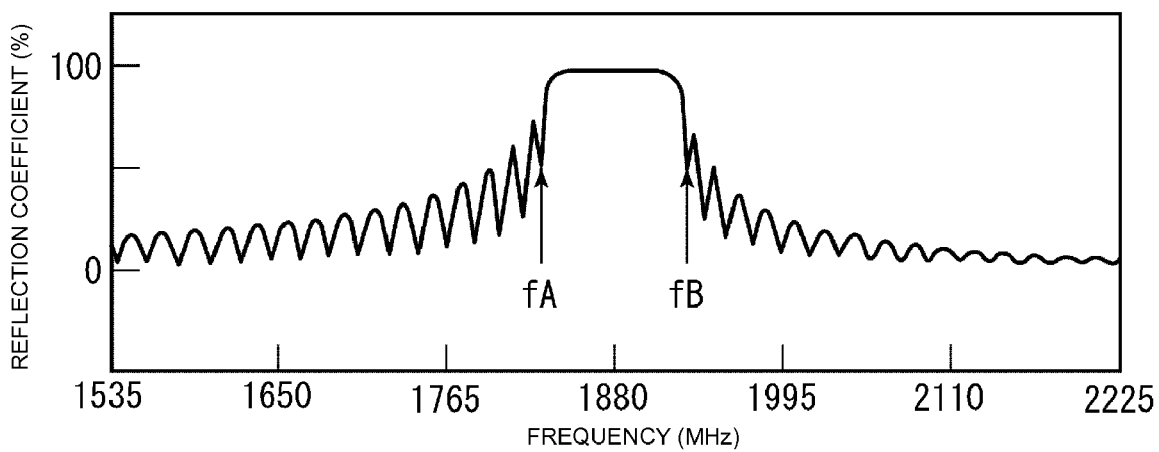
FIG. 6 shows the reflection characteristics of reflectors in first and second surface acoustic wave filters in the first preferred embodiment of the present invention.

FIG. 6 shows frequency characteristics of the reflection coefficient of the reflector 14. The stop band of the reflector 14 means the frequency band between a frequency fA and a frequency fB in FIG. 6, where fA denotes the start point of the stop band and fB denotes the end frequency of the stop band.

Although the reflection characteristics of the reflector 14 are shown in FIG. 6, the reflectors 15, 24, and 25 preferably have similar reflection characteristics.

Figure 7:
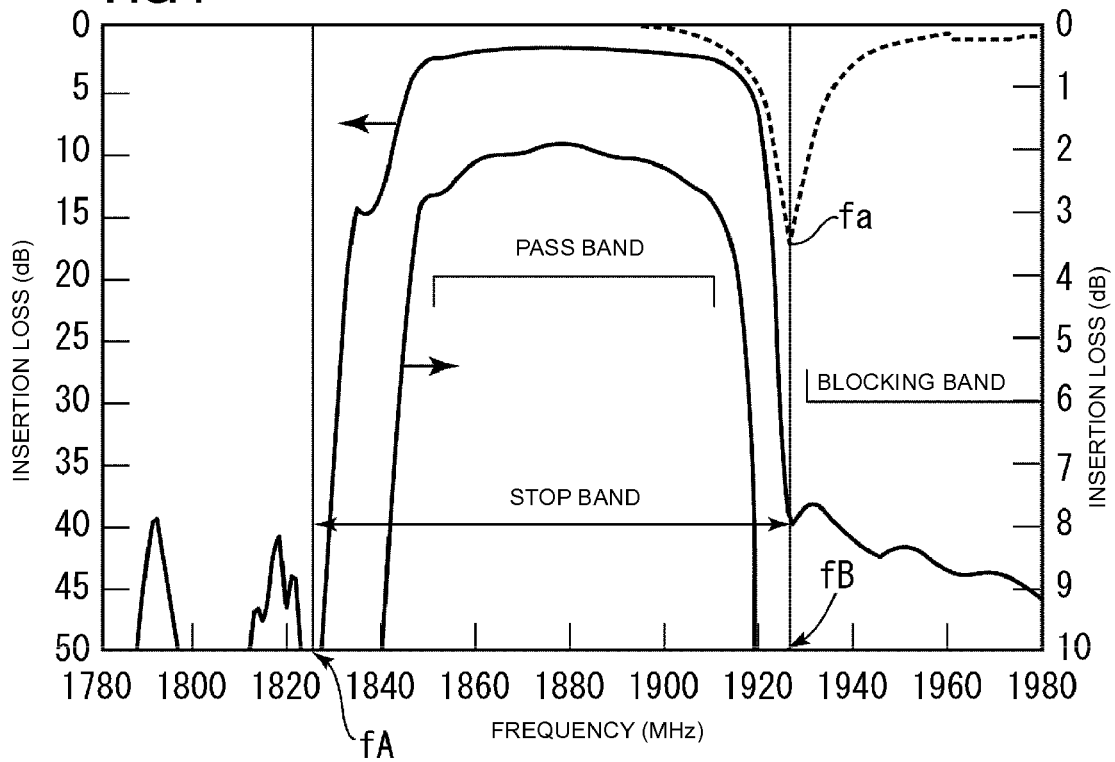
FIG. 7 is a graph showing the relationship among a stop band of the reflector in the surface acoustic wave filter, the amount of attenuation-frequency characteristics of the surface acoustic wave device, and the amount of attenuation-frequency characteristics of only a surface acoustic wave resonator.

FIG. 7 is a graph showing the relationship among the stop band of the reflector 14, the amount of attenuation-frequency characteristics of the surface acoustic wave device 1, and the amount of attenuation-frequency characteristics of the surface acoustic wave resonator 5. A solid line shows the amount of attenuation-frequency characteristics of the surface acoustic wave device 1 and a broken line shows the amount of attenuation-frequency characteristics of only the surface acoustic wave resonator 5.

The amount of attenuation of the surface acoustic wave resonator 5 is maximized at the location of an anti-resonant frequency fa. In the above-described preferred embodiment, the end frequency fB of the stop band of each of the reflectors 14, 15, 24, and 25 substantially corresponds to the anti-resonant frequency fa of the surface acoustic wave resonator 5, as shown in FIG. 7. Accordingly, it is possible to increase the amount of attenuation in the blocking band at the high-frequency side of the passband. This will be described with reference to FIGS. 8 and 9.

Figure 8:
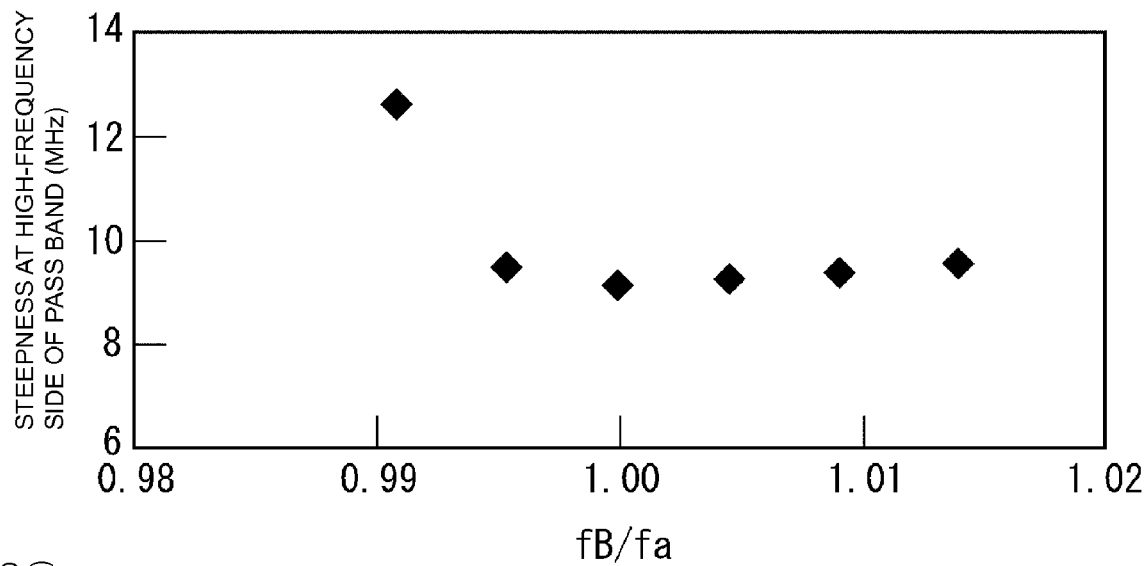
FIG. 8 is a graph showing the relationship between a ratio fB/fa and the steepness of filter characteristics at the high-frequency side of the passband.
Figure 9:
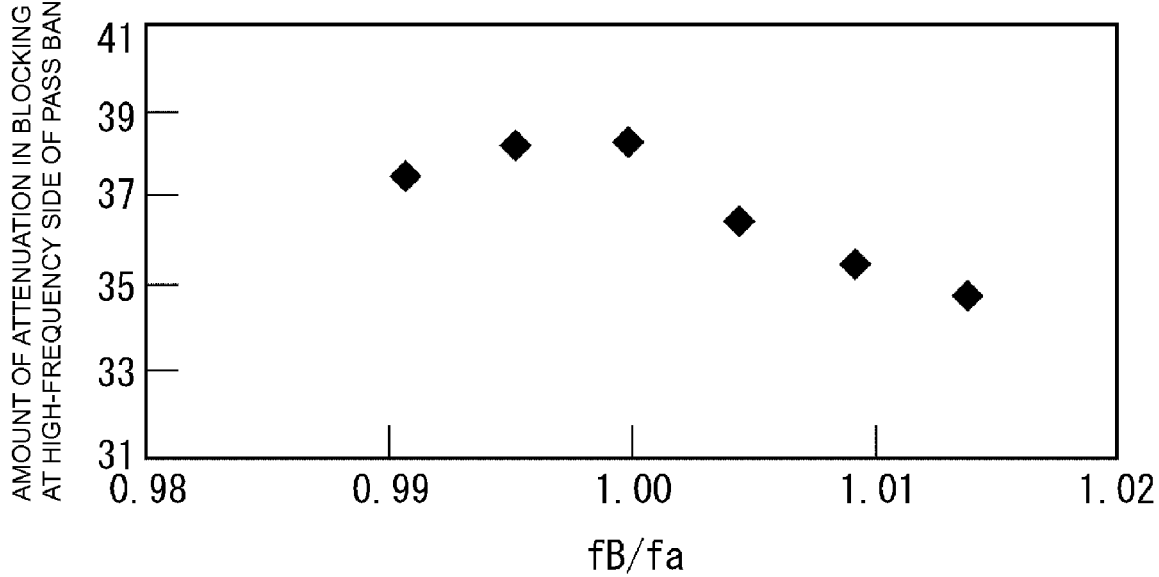
FIG. 9 is a graph showing the relationship between the ratio fB/fa and the amount of attenuation in the blocking band at the high-frequency side of the passband.

FIG. 8 is a graph showing how the steepness at the high-frequency side of the passband is varied when fB/fa is varied. FIG. 9 is a graph showing how the amount of attenuation is varied in the blocking band at the high-frequency side of the passband when fB/fa is varied.

FIG. 8 shows that the steepness at the high-frequency side of the passband is less than about 10 MHz and the excellent steepness is achieved when fB/fa is within a range from about 0.995 to about 1.015. FIG. 9 shows that the amount of attenuation at the high-frequency side of the passband is greater than about 35 dB when fB/fa is not greater than about 1.010. Accordingly, it is preferable to set fB/fa to a value within a range from about 0.995 to about 1.010.

As described above, when the first surface acoustic wave filter is cascade connected with the second surface acoustic wave filter, setting NA/NB to a value within the range from about 2.6 to about 3.5 and setting fB/fa to a value within the range from about 0.995 to about 1.010 enables the amount of attenuation in the blocking band at the high-frequency side of the passband to be sufficiently increased and the steepness of the filter characteristics at the high-frequency side of the passband to be increased. As described above, NA/NB is the ratio of the number of electrode fingers of the first IDT to the number of the second and third electrode fingers in the first surface acoustic wave filter to which the surface acoustic wave resonator is connected, and fB/fa is the ratio of the end frequency fB of the stop band of each of the reflectors in the first and second surface acoustic wave filters 3 and 4 to the anti-resonant frequency fa of the surface acoustic wave resonator 5.

Although the piezoelectric substrate 2 is preferably made of X-propagation $LiTaO_3$ that is Y-cut at 40±5°, for example, in the above-described preferred embodiment, the piezoelectric substrate 2 may preferably be made of $LiTaO_3$ having another cut angle, for example. Alternatively, the piezoelectric substrate may preferably be made of another piezoelectric single crystal, such as $LiNbO_3$ or quartz crystal, or piezoelectric ceramics, such as lead zirconate titanate ceramics, for example.

Although the first surface acoustic wave filter 3 is connected to the input terminal 6 and the second surface acoustic wave filter 4 is connected to the output terminal 7 in the above-described preferred embodiment, the first surface acoustic wave filter 3 may be connected to the output terminal and the second surface acoustic wave filter 4 may be connected to the input terminal.

In other words, the surface acoustic wave resonator 5 may be connected to either of the input side and the output side. Although the first surface acoustic wave filter 3 is cascade connected with the second surface acoustic wave filter 4 and the surface acoustic wave resonator 5 is connected to the input side of the surface acoustic wave device 1 in the surface acoustic wave device 1 of the first preferred embodiment, the present invention is not restricted to this configuration.

FIGS. 10 to 15 are schematic plan views showing electrode structures according to other preferred embodiments and a modification of a preferred embodiment of the present invention. In the second to sixth preferred embodiments and the modification, setting the ratio NA/NB between the numbers of electrode fingers to a value within the range from about 2.6 to about 3.5 and setting fB/fa to a value within the range from about 0.995 to about 1.010 enables the amount of attenuation to be sufficiently increased and the steepness of the filter characteristics to be increased in the blocking band at the high-frequency side of the passband, as in the above-described preferred embodiment.

Figure 10:
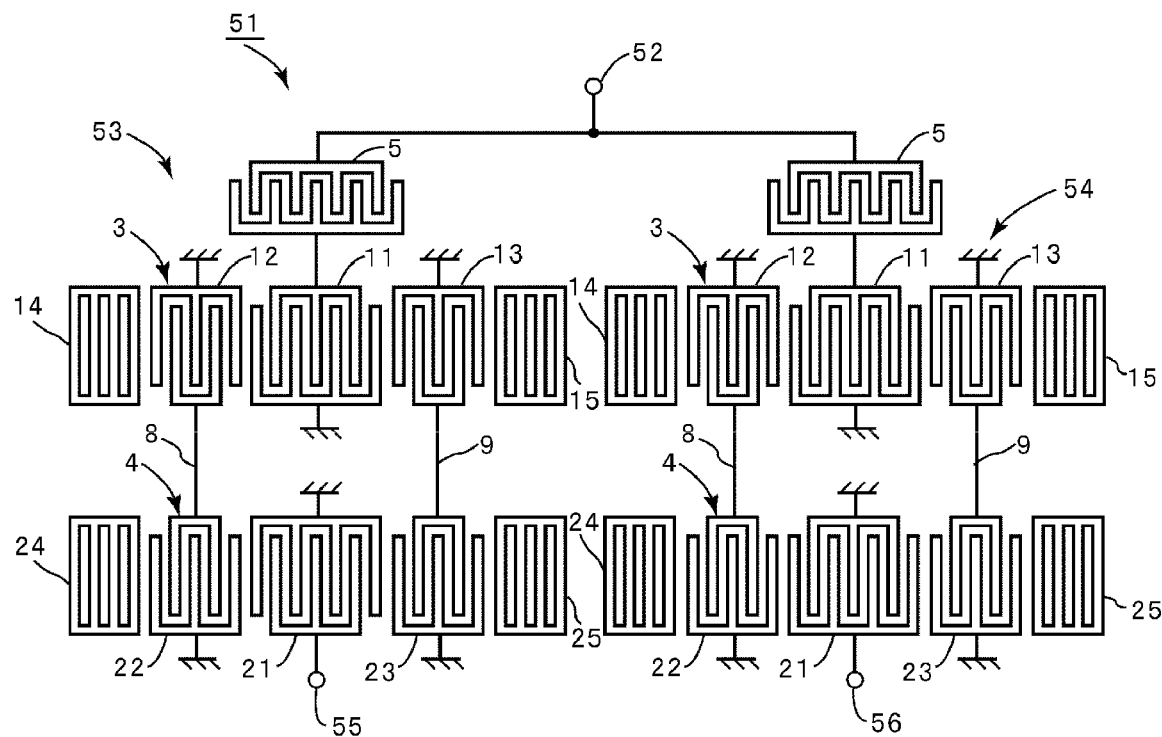
FIG. 10 is a schematic plan view showing the electrode structure of a surface acoustic wave device according to a second preferred embodiment of the present invention.

FIG. 10 is a plan view showing the electrode structure of a surface acoustic wave device according to a second preferred embodiment of the present invention.

A surface acoustic wave device 51 of the second preferred embodiment has a structure in which two surface acoustic wave devices 1 of the first preferred embodiment are connected to each other. Accordingly, the same reference numerals are used in the second preferred embodiment to identify the same portions as in the first surface acoustic wave device 1. A detailed description of such portions is omitted herein.

In the surface acoustic wave device 51, the input end of a first surface acoustic wave device 53 and the input end of a second surface acoustic wave device 54 are connected to an unbalanced terminal 52. Each of the first and second surface acoustic wave devices 53 and 54 have the same or substantially the same structure as that of the surface acoustic wave device 1 of the first preferred embodiment.

The output end of the first surface acoustic wave device 53 is electrically connected to a first balanced terminal 55 and the output end of the second surface acoustic wave device 54 is electrically connected to a second balanced terminal 56. The two surface acoustic wave devices of the first preferred embodiment may be used in the above-described manner to configure the surface acoustic wave device so as to have a balance-unbalance conversion function.

In order to achieve the balance-unbalance conversion function, the IDT 21 of the first surface acoustic wave device 53 has a polarity opposite to that of the IDT 21 of the second surface acoustic wave device 54 so that a signal that is input through the unbalanced terminal 52 and is output from the first balanced terminal 55 is out of phase with a signal that is input through the unbalanced terminal 52 and is output from the second balanced terminal 56 by about 180°.

Figure 11:
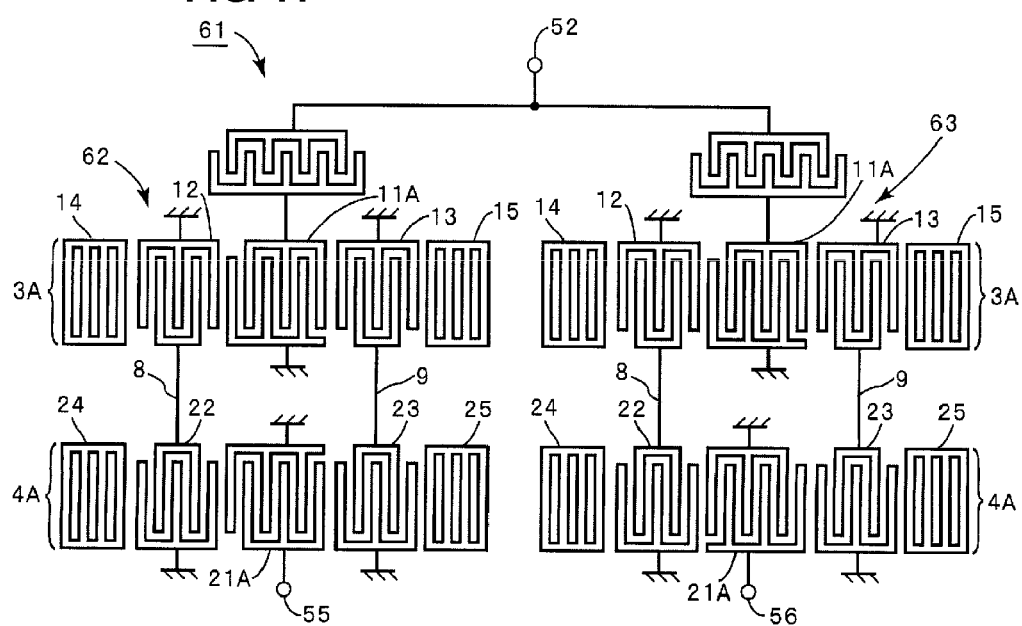
FIG. 11 is a schematic plan view showing the electrode structure of a surface acoustic wave device according to a modification of the second preferred embodiment of the present invention.

FIG. 11 is a schematic plan view showing the electrode structure of a surface acoustic wave device 61 according to a modification of the surface acoustic wave device 51 of the second preferred embodiment. In the surface acoustic wave device 61, first and second surface acoustic wave devices 62 and 63 are connected to the unbalanced terminal 52. The output end of the first surface acoustic wave device 62 is connected to the first balanced terminal 55 and the output end of the second surface acoustic wave device 63 is connected to the second balanced terminal 56. This modification differs from the surface acoustic wave device 51 of the second preferred embodiment in that a central IDT 11A has an even number of electrode fingers in a first surface acoustic wave filter 3A in each of the surface acoustic wave devices 62 and 63. The remainder of the surface acoustic wave device 61 is configured in the same or substantially the same manner in the surface acoustic wave device 51. Accordingly, the phase of an electrical signal flowing through the first signal line 8 is the opposite polarity to that of an electrical signal flowing through the second signal line 9.

Figure 12:
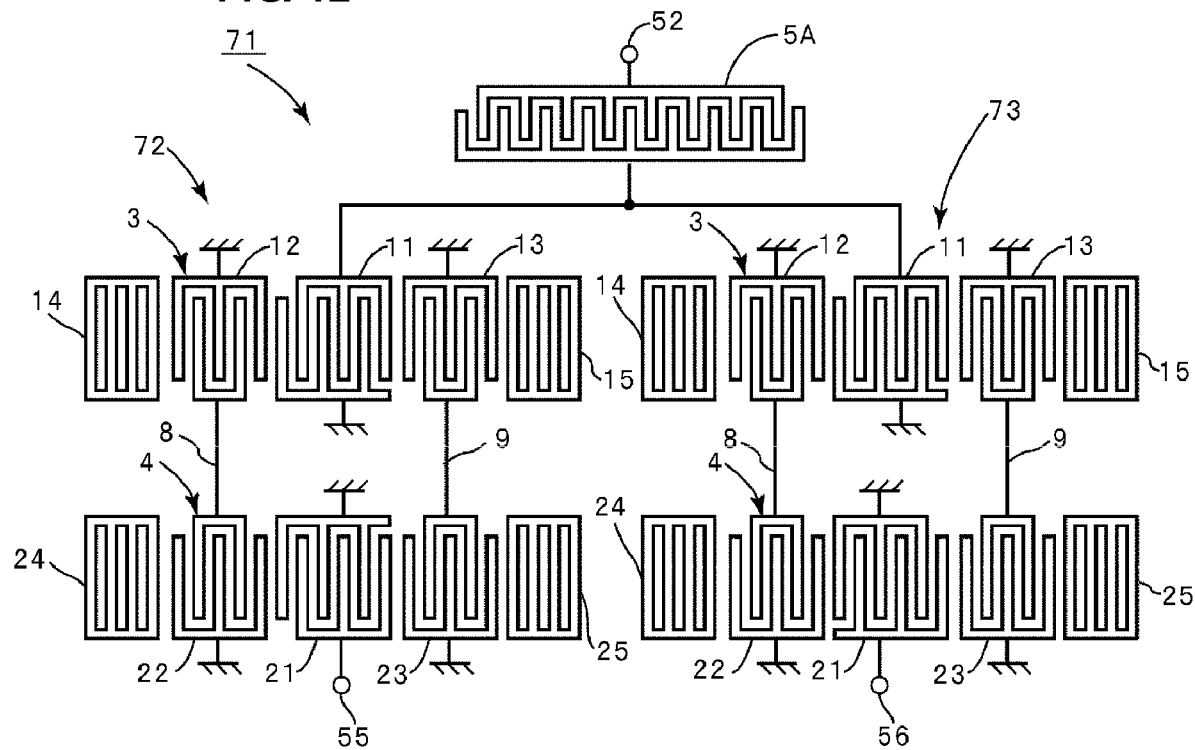
FIG. 12 is a schematic plan view showing the electrode structure of a surface acoustic wave device according to a third preferred embodiment of the present invention.

FIG. 12 is a schematic plan view showing the electrode structure of a surface acoustic wave device according to a third preferred embodiment of the present invention. A surface acoustic wave device 71 of the third preferred embodiment includes the unbalanced terminal 52 and the first and second balanced terminals 55 and 56. First and second surface acoustic wave devices 72 and 73 are connected to the unbalanced terminal 52 via one surface acoustic wave resonator 5A. Each of the surface acoustic wave devices 72 and 73 have the same or substantially the same electrode structure as that of the surface acoustic wave device 1 of the first preferred embodiment except that the surface acoustic wave resonator 5 is not provided. As in the second preferred embodiment, the polarity of each IDT in the first and second surface acoustic wave devices 72 and 73 is selected so that a signal output from the balanced terminal 55 in the first surface acoustic wave device 72 is out of phase with a signal output from the second balanced terminal 56 in the second surface acoustic wave device 73 by about 180°.

The surface acoustic wave resonator 5A is shared between the two surface acoustic wave devices 72 and 73 in the present preferred embodiment.

Accordingly, in the present preferred embodiment, the surface acoustic wave resonator is not connected between the two cascade connected surface acoustic wave devices. As a result, as in the first preferred embodiment, it is possible to reduce the space between the stages to further reduce the size of the surface acoustic wave device. In addition, in the present preferred embodiment, setting NA/NB to a value within the range from about 2.6 to about 3.5 and setting fB/fa to a value within the range from about 0.995 to about 1.010 cause the amount of attenuation to be increased and the steepness of the filter characteristics to be increased in the blocking band at the high-frequency side of the passband.

Figure 13:
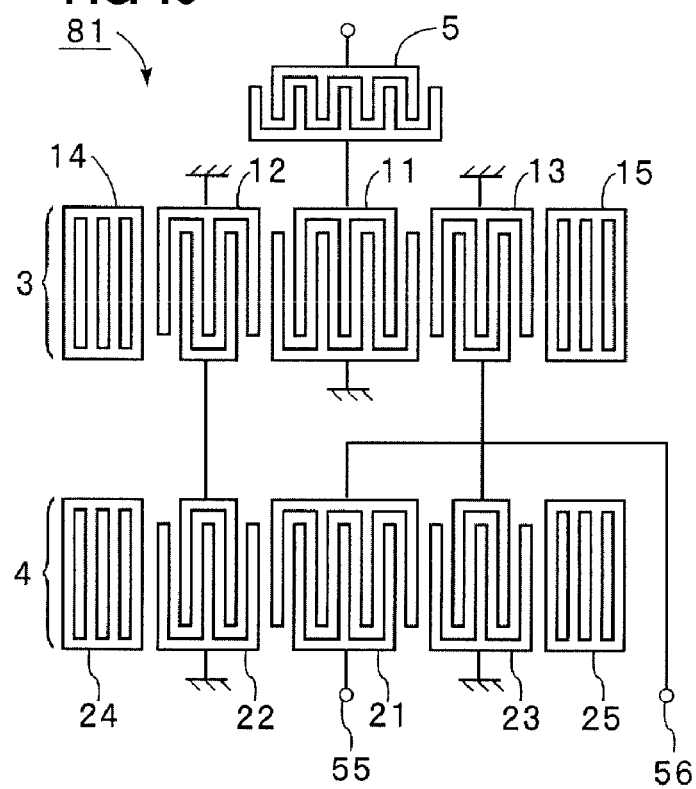
FIG. 13 is a schematic plan view showing the electrode structure of a surface acoustic wave device according to a fourth preferred embodiment of the present invention.

FIG. 13 is a schematic plan view showing the electrode structure of a surface acoustic wave device according to a fourth preferred embodiment of the present invention.

A surface acoustic wave device 81 of the fourth preferred embodiment has a structure in which the first surface acoustic wave filter 3 is cascade connected with the second surface acoustic wave filter 4 and in which the surface acoustic wave resonator 5 is connected to one end of the first IDT 11 in the first surface acoustic wave filter 3, as in the surface acoustic wave device 1 of the first preferred embodiment. However, the surface acoustic wave device 81 differs from the surface acoustic wave device 1 in that the surface acoustic wave device 81 includes the first and second balanced terminals 55 and 56 and in that one end of the first IDT 21 in the second surface acoustic wave filter 4 is connected to the first balanced terminal 55 and the other end thereof is connected to the second balanced terminal 56. The surface acoustic wave device 81 differs from the surface acoustic wave device 1 in that the IDTs 11 to 13 and the IDTs 21 to 23 are configured so that a signal that is input through the unbalanced terminal 52 and is output from the first balanced terminal 55 is out of phase with a signal that is input through the unbalanced terminal 52 and is output from the second balanced terminal 56 by about 180°.

Accordingly, in the surface acoustic wave device 81 of the present preferred embodiment in which the two 3-IDT longitudinally-coupled resonator-type surface acoustic wave filters are cascade connected with each other, it is possible to reduce the size of the surface acoustic wave device without connecting the surface acoustic wave resonator between the stages. In addition, the connection of the surface acoustic wave resonator 5 and the setting of NA/NB and fB/fa to values within the above-described predetermined ranges cause the amount of attenuation to be increased and cause the steepness of the filter characteristics to be increased in the blocking band at the high-frequency side of the passband.

Figure 14:
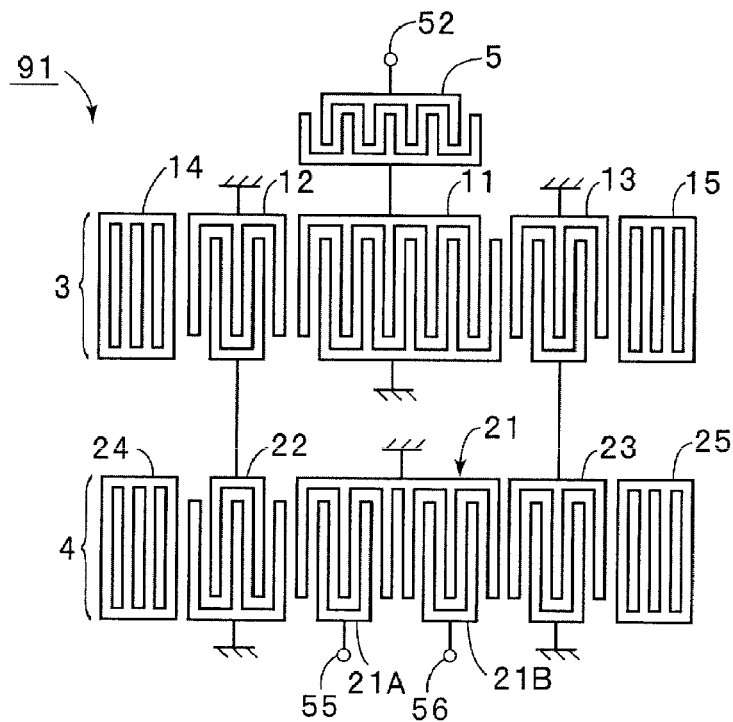
FIG. 14 is a schematic plan view showing the electrode structure of a surface acoustic wave device according to a fifth preferred embodiment of the present invention.

FIG. 14 is a schematic plan view showing the electrode structure of a surface acoustic wave device according to a fifth preferred embodiment of the present invention. A surface acoustic wave device 91 of the fifth preferred embodiment is configured in the same or substantially the same manner as in the surface acoustic wave device 81 of the fourth preferred embodiment except that the surface acoustic wave device 91 has an electrode structure that is different from that of the surface acoustic wave device 81 so as to provide the balance-unbalance conversion function. Specifically, in the surface acoustic wave device 91, the first IDT 21 in the second surface acoustic wave filter 4 includes first and second separated IDT portions 21A and 21B defined by the first IDT 21 in the second surface acoustic wave filter 4 being separated in the direction in which the surface acoustic waves propagate. The first separated IDT portion 21A is electrically connected to the first balanced terminal 55 and the second separated IDT portion 21B is electrically connected to the second balanced terminal 56. Also in the present preferred embodiment, the IDTs 11 to 13 and the IDTs 21 to 23 are configured so that a signal output from the first balanced terminal 55 is out of phase with a signal output from the second balanced terminal 56 by about 180°.

Also in the present preferred embodiment, setting NA/NB and fB/fa to values within the above-described predetermined ranges causes the steepness of the filter characteristics in the blocking band at the high-frequency side of the passband and the amount of attenuation in the blocking band to be increased. In addition, since the surface acoustic wave resonator 5 is not provided between the stages, it is possible to reduce the size of the surface acoustic wave device.

Figure 15:
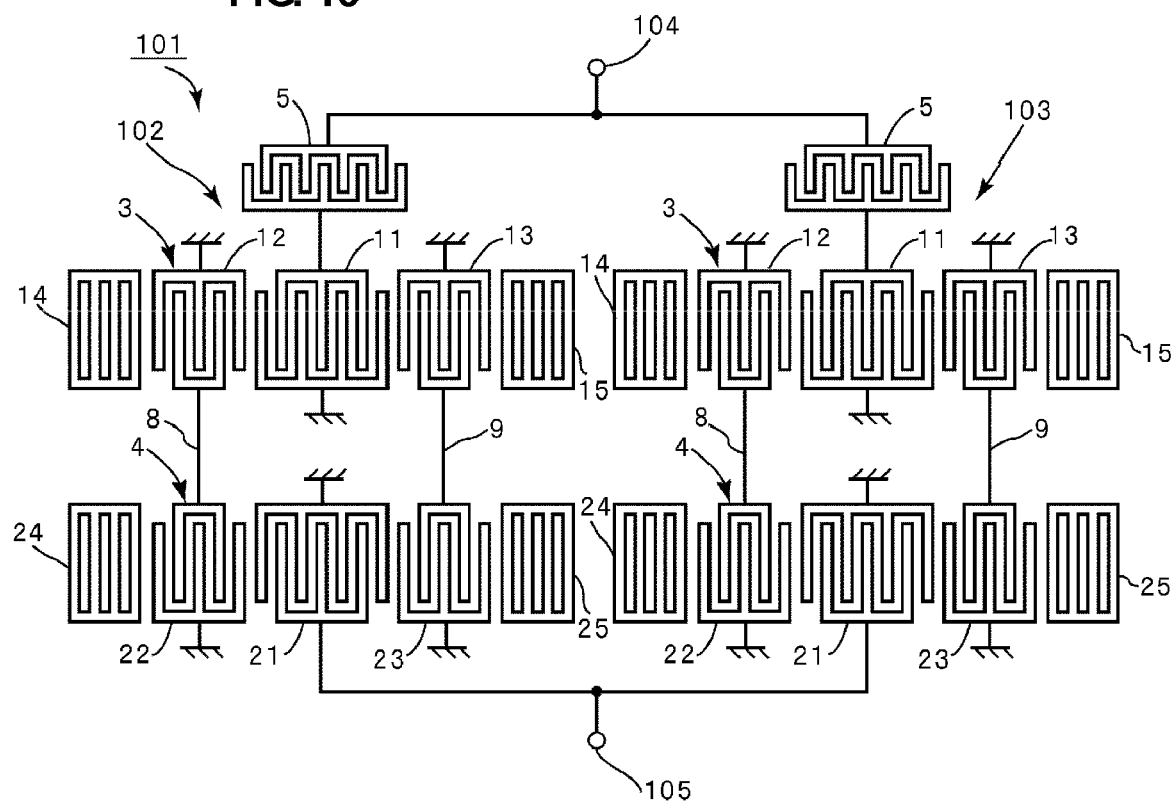
FIG. 15 is a schematic plan view showing the electrode structure of a surface acoustic wave device according to a sixth preferred embodiment of the present invention.

FIG. 15 is a schematic plan view showing the electrode structure of a surface acoustic wave device 101 according to a sixth preferred embodiment of the present invention.

Two surface acoustic wave devices 1 of the first preferred embodiment are also used in the surface acoustic wave device 101 of the present preferred embodiment, as in the second preferred embodiment. The two surface acoustic wave devices are referred to as first and second surface acoustic wave devices 102 and 103. Since the first and second surface acoustic wave devices 102 and 103 are configured in the same or substantially the same manner as in the surface acoustic wave device 1 of the first preferred embodiment, the same reference numerals are used in the sixth preferred embodiment to identify the same portions as in the surface acoustic wave device 1 of the first preferred embodiment. A detailed description of such portions is omitted herein.

The input end of the first surface acoustic wave device 102 and the input end of the second surface acoustic wave device 103 are electrically connected to a first unbalanced terminal 104 in the present preferred embodiment. The output end of the first surface acoustic wave device 102 and the output end of the second surface acoustic wave device 103 are electrically connected to a second unbalanced terminal 105. Accordingly, the surface acoustic wave device 101 with unbalanced input-unbalanced output is provided. Since the surface acoustic wave resonators 5, 5 are not connected between the stages also in the present preferred embodiment, it is possible to reduce the size of the surface acoustic wave device. In addition, the connection of the surface acoustic wave resonators 5, 5 and the setting of NA/NB and fB/fa to values within the above-described predetermined ranges cause the amount of attenuation in the blocking band at the high-frequency side of the passband and the steepness of the filter characteristics at the high-frequency side of the passband to be increased.

Although the surface acoustic wave devices are described above, the present invention is applicable to a boundary acoustic wave device utilizing boundary acoustic waves.

Figure 16:
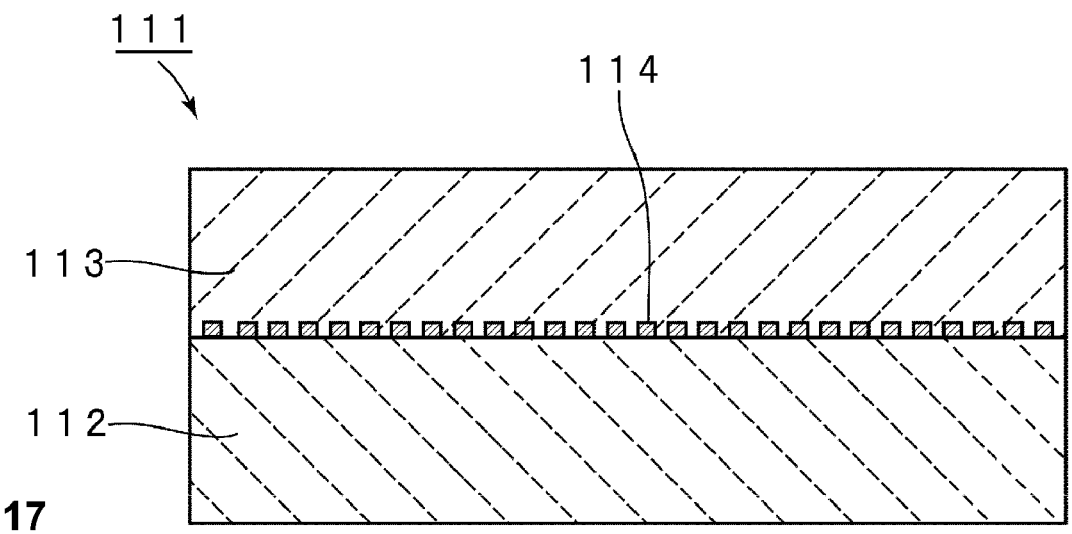
FIG. 16 is a schematic cross-sectional front view schematically showing the layered structure of a boundary acoustic wave device to which a preferred embodiment of the present invention is applied.
Figure 17:
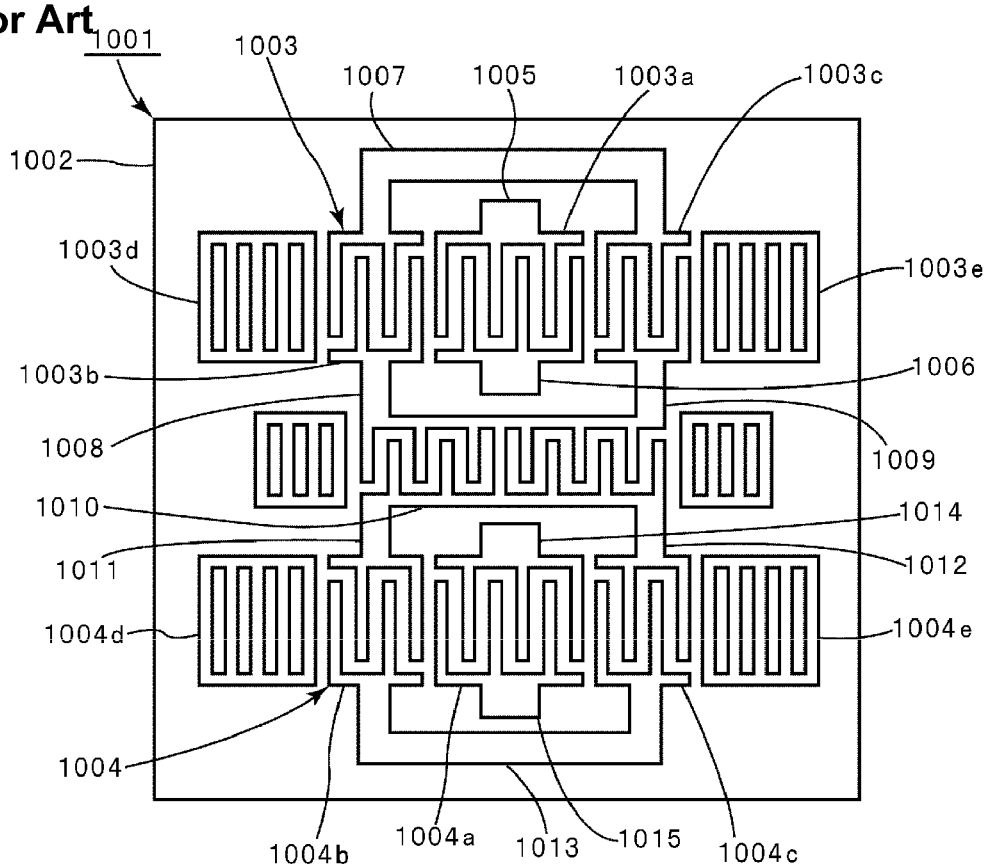
FIG. 17 is a schematic plan view showing the electrode structure of a surface acoustic wave device in related art.

FIG. 16 is a cross-sectional view schematically showing the structure of a typical boundary acoustic wave device. A boundary acoustic wave device 111 includes a first medium 112 made of a piezoelectric material and a second medium 113 made of a dielectric material. An electrode structure 114 is provided at the boundary between the first and second media 112 and 113. First and second longitudinally-coupled resonator-type boundary acoustic wave filters and an acoustic wave resonator according to a preferred embodiment of the present invention are provided as the electrode structure 114. This provides the boundary acoustic wave device according to a preferred embodiment of the present invention which utilizes boundary acoustic waves propagated on the boundary between the first and second media 112 and 113.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave device comprising:
   first and second longitudinally-coupled resonator-type acoustic wave filters each including a piezoelectric substrate, a first IDT provided on the piezoelectric substrate, second and third IDTs arranged on either side of the first IDT in a direction in which surface waves propagate, and a pair of reflectors arranged on either side of a portion in which the first to third IDTs are provided in the direction in which the surface waves propagate; and
   an acoustic wave resonator provided on the piezoelectric substrate; wherein
   the second IDT in the first acoustic wave filter is electrically connected to the second IDT in the second acoustic wave filter and the third IDT in the first acoustic wave filter is electrically connected to the third IDT in the second acoustic wave filter to cascade the first acoustic wave filter with the second acoustic wave filter;
   the acoustic wave resonator is connected to an end of the first IDT in the first acoustic wave filter, which is opposite to the second acoustic wave filter, and NA/NB is in a range from about 2.6 to about 3.5 where NA denotes the number of electrode fingers of the first IDT in the first acoustic wave filter and NB denotes the number of electrode fingers of each of the second and third IDTs in the first acoustic wave filter; and
   fB/fa is in a range from about 0.995 to about 1.010 where fB denotes the end frequency of a stop band of each of the reflectors in the first and second acoustic wave filters and fa denotes an anti-resonant frequency of the acoustic wave resonator.

2. An acoustic wave device including two acoustic wave devices according to claim 1, wherein when the two acoustic wave devices are referred to as a first acoustic wave device and a second acoustic wave device, one end of the first acoustic wave device and one end of the second acoustic wave device are connected to an unbalanced terminal, the other end of the first acoustic wave device is connected to a first balanced terminal, and the other end of the second acoustic wave device is connected to a second balanced terminal; and all of the first to third IDTs in the first and second acoustic wave devices are arranged so that an output signal corresponding to an input signal in the first acoustic wave device is out of phase with an output signal corresponding to an input signal in the second acoustic wave device by about 180° to provide a balance-unbalance conversion function.

3. The acoustic wave device according to claim 1, wherein the first IDT in the first acoustic wave filter is connected to an unbalanced terminal via the acoustic wave resonator, one end of the first IDT in the second acoustic wave filter is connected to a first balanced terminal, and the other end thereof is connected to a second balanced terminal; and all of the first to third IDTs in the first and second acoustic wave filters are arranged so that a signal flowing from the unbalanced terminal to the first balanced terminal is out of phase with a signal flowing from the unbalanced terminal to the second balanced terminal by about 180°.

4. The acoustic wave device according to claim 1, wherein one end of the first IDT in the first acoustic wave filter is connected to an unbalanced terminal via the acoustic wave resonator;

the first IDT in the second acoustic wave filter includes first and second separated IDT portions that are separated in the direction in which acoustic waves propagate and the first and second separated IDT portions are connected to first and second balanced terminals, respectively; and all of the first to third IDTs in the first and second acoustic wave filters are arranged so that a signal flowing from the unbalanced terminal to the first balanced terminal is out of phase with a signal flowing from the unbalanced terminal to the second balanced terminal by about 180°.

5. An acoustic wave device comprising two acoustic wave devices according to claim 1, wherein, when the two acoustic wave devices are referred to as a first acoustic wave device and a second acoustic wave device, one end of the first acoustic wave device and one end of the second acoustic wave device are connected to a first unbalanced terminal and the other end of the first acoustic wave device and the other end of the second acoustic wave device are connected to a second unbalanced terminal to define an unbalance input-output acoustic wave device.

6. The acoustic wave device according to claim 1, wherein a surface acoustic wave is generated as the acoustic wave and the acoustic wave device is a surface acoustic wave device.

7. The acoustic wave device according to claim 1, wherein a boundary acoustic wave is generated as the acoustic wave and the acoustic wave device is a boundary acoustic wave device.

* * * * *